United States Patent
Wu et al.

(10) Patent No.: US 12,456,975 B2
(45) Date of Patent: Oct. 28, 2025

(54) VOLTAGE SUPPLY SWITCH INTERLOCK LOGIC

(71) Applicant: pSemi Corporation, San Diego, CA (US)

(72) Inventors: Gary Chunshien Wu, San Diego, CA (US); Gregory Szczeszynski, Nashua, NH (US)

(73) Assignee: pSemi Corporation, San Diego, CA (US)

( * ) Notice: Subject to any disclaimer, the term of this patent is extended or adjusted under 35 U.S.C. 154(b) by 13 days.

(21) Appl. No.: 18/664,635

(22) Filed: May 15, 2024

(65) Prior Publication Data

US 2024/0396544 A1  Nov. 28, 2024

Related U.S. Application Data

(60) Provisional application No. 63/504,337, filed on May 25, 2023.

(51) Int. Cl.
*H03K 17/30* (2006.01)
*H03K 19/0185* (2006.01)
*H03K 19/0948* (2006.01)

(52) U.S. Cl.
CPC ... *H03K 17/302* (2013.01); *H03K 19/018521* (2013.01); *H03K 19/0948* (2013.01)

(58) Field of Classification Search
CPC .................. H03K 19/018521; H03K 19/0948
See application file for complete search history.

(56) References Cited

U.S. PATENT DOCUMENTS

| | | | | |
|---|---|---|---|---|
| 10,917,012 | B1* | 2/2021 | Heiling | H02M 1/08 |
| 12,074,517 | B2* | 8/2024 | Sharifi | H02M 3/157 |
| 2003/0231033 | A1* | 12/2003 | Koch, II | H03K 17/163 |
| | | | | 327/108 |
| 2018/0343001 | A1* | 11/2018 | Srirattana | H03H 11/342 |

* cited by examiner

*Primary Examiner* — Sibin Chen
(74) *Attorney, Agent, or Firm* — Haynes and Boone, LLP (57) ABSTRACT

Circuits and methods that enable a "break-before-make" process for an electronic switch that avoids the relatively large time delays of fixed time delay circuitry. Logic gates, rather than a time delay, are used to lock out an input switch through-path from turning ON before another input switch through-path is fully turned OFF. An embodiment includes a first and second monitor logic blocks, configured such that (1) a first through-path is turned OFF before a first shunt-path is allowed to turn ON and before a second shunt-path is allowed to turn OFF, and the second shunt-path is turned OFF before a second through-path is allowed to turn ON; and (2) the second through-path is turned OFF before the second shunt-path is allowed to turn ON and before the first shunt-path is allowed to turn OFF, and the first shunt-path is turned OFF before the first through-path is allowed to turn ON.

15 Claims, 8 Drawing Sheets

VOLTAGE SUPPLY SWITCH INTERLOCK LOGIC

CROSS-REFERENCE TO RELATED APPLICATIONS-CLAIM OF PRIORITY

The present application claims priority to the following patent application, assigned to the assignee of the present invention, the contents of which are incorporated by reference: U.S. Provisional Patent Application Ser. No. 63/504,337, filed May 25, 2023, entitled "Voltage Supply Switch Interlock Logic".

BACKGROUND

(1) Technical Field

This invention relates to electronic circuits, and more particularly to control circuitry for electronic switches.

(2) Background

An electronic switch, such as a single-pole, double-throw (SPDT) switch configuration, may use N-type MOSFETs (NFETs) to pass or block a DC voltage from a selected source. Turning NFETs ON to a conductive state generally requires a power converter, such as a capacitor-based charge pump, which generates a voltage that is approximately the DC input voltage applied to a switch input plus a system supply voltage (e.g., $V_{DD}$).

An important aspect of controlling the NFETs of an electronic switch is preventing two or more input FETs connected to the same output from turning on at the same time, even for a very short duration, to avoid damage if conflicting voltage levels could occur. In conventional electronic switches, fixed time delay circuitry is used to generate "dead times" in a "break-before-make" process-that is, to lock out an input switch from turning ON before another input switch is fully turned OFF. However, fixed time delay circuitry often results in a relatively slow electronic switch, for a number of reasons. For example, switch NFETs are generally large and thus have large gate capacitance, so the rise and fall times at the gate of an NFET can take a long time and also vary with process, voltage, and temperature (PVT). Further, it may take more time for a charge pump to turn ON the NFETs in a switch through-path when the input is at a high voltage compared to when the input is at a low voltage. Accordingly, the time duration set for a fixed time delay circuit must take into account the worst-case characteristics of an electronic switch, in addition to having an adequate margin, which may make meeting a switching time specification challenging.

There is a need for circuits and methods that enable a "break-before-make" process for an electronic switch that avoids the relatively large time delays of fixed time delay circuitry.

SUMMARY

The present invention encompasses circuits and methods that enable a "break-before-make" process for an electronic switch that avoids the relatively large time delays of fixed time delay circuitry. Logic gates, rather than a time delay, are used to lock out an input switch through-path from turning ON before another input switch through-path is fully turned OFF.

A circuit embodiment of the invention includes electronic switch, including: a first through-path coupled between a first input terminal and an output terminal, and a first shunt-path coupled between the first through-path and a reference potential; a second through-path coupled between a second input terminal and the output terminal, and a second shunt-path coupled between the second through-path and a reference potential; a first monitor logic block coupled to respective control inputs of the first through-path, the first shunt-path, and the second shunt path, the first monitor logic block responsive to a first combination of a first control signal and a second control signal; a second monitor logic block coupled to respective control inputs of the second through-path, the second shunt-path, and the first shunt path, the second monitor logic block responsive to a second combination of the first control signal and the second control signal; wherein the first monitor logic block and the second monitor logic block are configured such that the first through-path is turned OFF before the first shunt-path is allowed to turn ON and before the second shunt-path is allowed to turn OFF, and the second shunt-path is turned OFF before the second through-path is allowed to turn ON; and wherein the first monitor logic block and the second monitor logic block are configured such that the second through-path is turned OFF before the second shunt-path is allowed to turn ON and before the first shunt-path is allowed to turn OFF, and the first shunt-path is turned OFF before the first through-path is allowed to turn ON.

Another embodiment of the invention includes a method of operating an electronic switch that includes a first through-path coupled between a first input terminal and an output terminal, and a first shunt-path coupled between the first through-path and a reference potential, and a second through-path coupled between a second input terminal and the output terminal, and a second shunt-path coupled between the second through-path and a reference potential, the method including: coupling a first monitor logic block to respective control inputs of the first through-path, the first shunt-path, and the second shunt path; coupling a second monitor logic block to respective control inputs of the second through-path, the second shunt-path, and the first shunt path; configuring the first monitor logic block and the second monitor logic block to set the electronic switch to a first signal conducting state by: turning the first through-path OFF, thereafter, turning the first shunt-path ON and turning the second shunt-path OFF, and thereafter, turning the second through-path ON; and configuring the first monitor logic block and the second monitor logic block to set the electronic switch to a second signal conducting state by: turning the second through-path OFF, thereafter, turning before the second shunt-path ON and turning the first shunt-path OFF, and thereafter, turning the first through-path ON.

The details of one or more embodiments of the invention are set forth in the accompanying drawings and the description below. Other features, objects, and advantages of the invention should be apparent from the description and drawings, and from the claims.

DESCRIPTION OF THE DRAWINGS

Like reference numbers and designations in the various drawings indicate like elements unless the context requires otherwise.

DETAILED DESCRIPTION

The present invention encompasses circuits and methods that enable a "break-before-make" process for an electronic switch that avoids the relatively large time delays of fixed time delay circuitry. Logic gates, rather than a time delay, are used to lock out an input switch through-path from turning ON before another input switch through-path is fully turned OFF.

Figure 1:
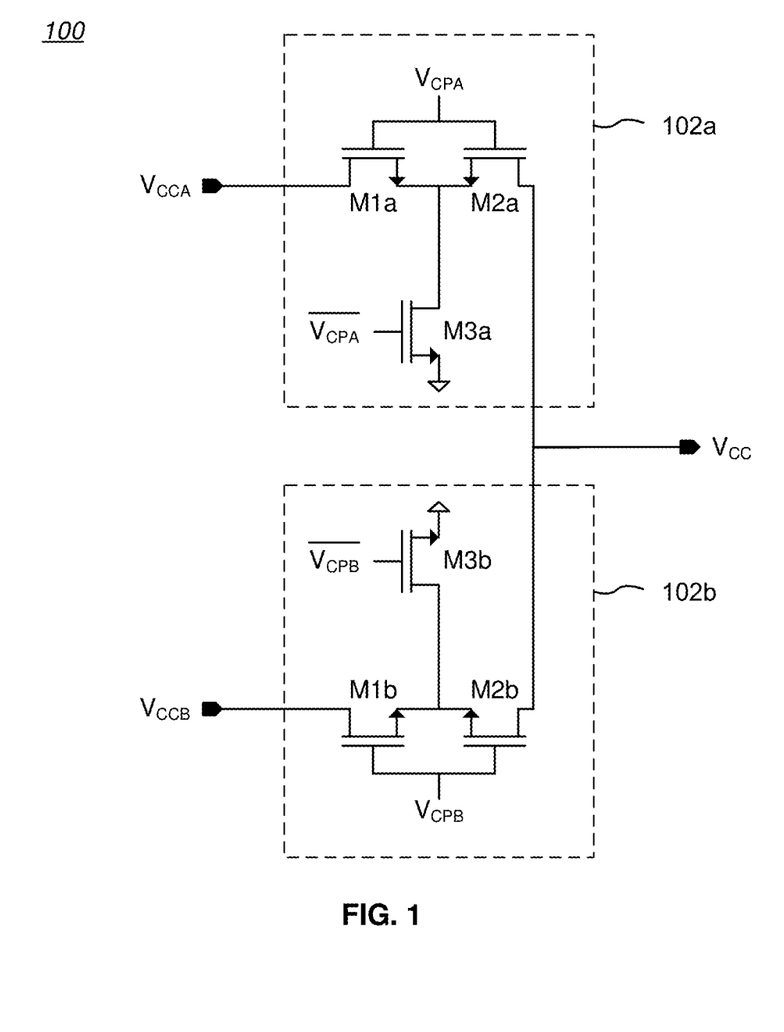
FIG. 1 is a schematic diagram of an example SPDT electronic switch implemented using NFETs.

For context purposes, FIG. 1 is a schematic diagram of an example SPDT electronic switch 100 implemented using NFETs. Circuit block 102a comprises NFETs in a "T-switch" configuration having a through-path (NFETs M1a and M2a having conduction channels connected in series) between an input terminal $V_{CCA}$ and an output terminal $V_{CC}$, and a shunt-path (NFET M3a) between a node between NFETs M1a and M2a and a reference potential, such as circuit ground. Note that if no isolation requirement exists, only NFETs M1a and M1b are necessary, where their outputs can be tied together. In such a case, NFETs M2a, M3a, M2b, and M3b may be eliminated.

For the illustrated T-switch configuration, the gates of NFETs M1a and M2a are coupled in common to a control voltage $V_{CPA}$, while the gate of NFET M3a is coupled to a complementary control voltage $\overline{V_{CPA}}$. Similarly, circuit block 102b comprises NFETs in a "T-switch" configuration having a through-path (NFETs M1b and M2b having conduction channels connected in series) between an input terminal $V_{CCB}$ and the output terminal $V_{CC}$, and a shunt-path (NFET M3b) between a node between NFETs M1b and M2b and the reference potential. The gates of NFETs M1b and M2b are coupled in common to a control voltage $\overline{V_{CPB}}$, while the gate of NFET M3b is coupled to a complementary control voltage $\overline{V_{CPB}}$. In some embodiments, in order to withstand applied voltages exceeding the breakdown voltage of a single NFET, one or more of the NFETs may comprise a stack of serially connected NFETs controlled by a common gate signal so as to function like a single NFET.

In operation, a DC voltage applied to input terminal $V_{CCA}$ of circuit block 102a is coupled through to the output terminal $V_{CC}$ by turning M1a and M2a ON and M3a OFF; conversely, a voltage applied to input terminal $V_{CCA}$ is blocked from the output terminal $V_{CC}$ by turning M1a and M2a OFF and M3a ON. Circuit block 102b operates in a similar manner: a DC voltage applied to input terminal $V_{CCB}$ is coupled through to the output terminal $V_{CC}$ by turning M1b and M2b ON and M3b OFF; conversely, a voltage applied to input terminal $V_{CCB}$ is blocked from the output terminal $V_{CC}$ by turning M1b and M2b OFF and M3b ON. Control signals (not shown) would initiate selection of a through-path to connect $V_{CCA}$ or $V_{CCB}$ to $V_{CC}$.

From the nature of NFETs, the gate voltage required to turn an NFET ON must be greater than the voltage applied to the input terminal ($V_{CCA}$ or $V_{CCB}$ in this example). In many applications, a charge pump is used to turn ON the through-path NFETs by adding a voltage above the voltages at the input terminals ($V_{CCA}$ or $V_{CCB}$, depending on which through-path to turn ON). Accordingly, the control voltages $V_{CPA}$ and $V_{CPB}$ and their complements are boosted by a charge pump (not shown). For example, if $V_{CCA}$ is 5V and the supply voltage is 3V, then a charge pump may add a voltage of about 3 V to make $V_{CPA}$ be about 8 V.

While FIG. 1 shows an NFET implementation of an electronic switch, electronic switches may be implemented using PFETs; the present invention can be readily adapted to such an embodiment.

One aspect of the present invention is the realization that a time delay between switching through-path states is not needed if logic is applied to monitor through-path switch states. In particular, it was realized that in order to avoid damage to the electronic switch 100, the through-path NFETs for a particular input cannot turn ON until two conditions are met: (1) the through-path NFETs at all other inputs need to be fully OFF, and (2) for a T-switch (isolated) configuration, the shunt NFET for the particular input is fully turned OFF.

Figure 2:
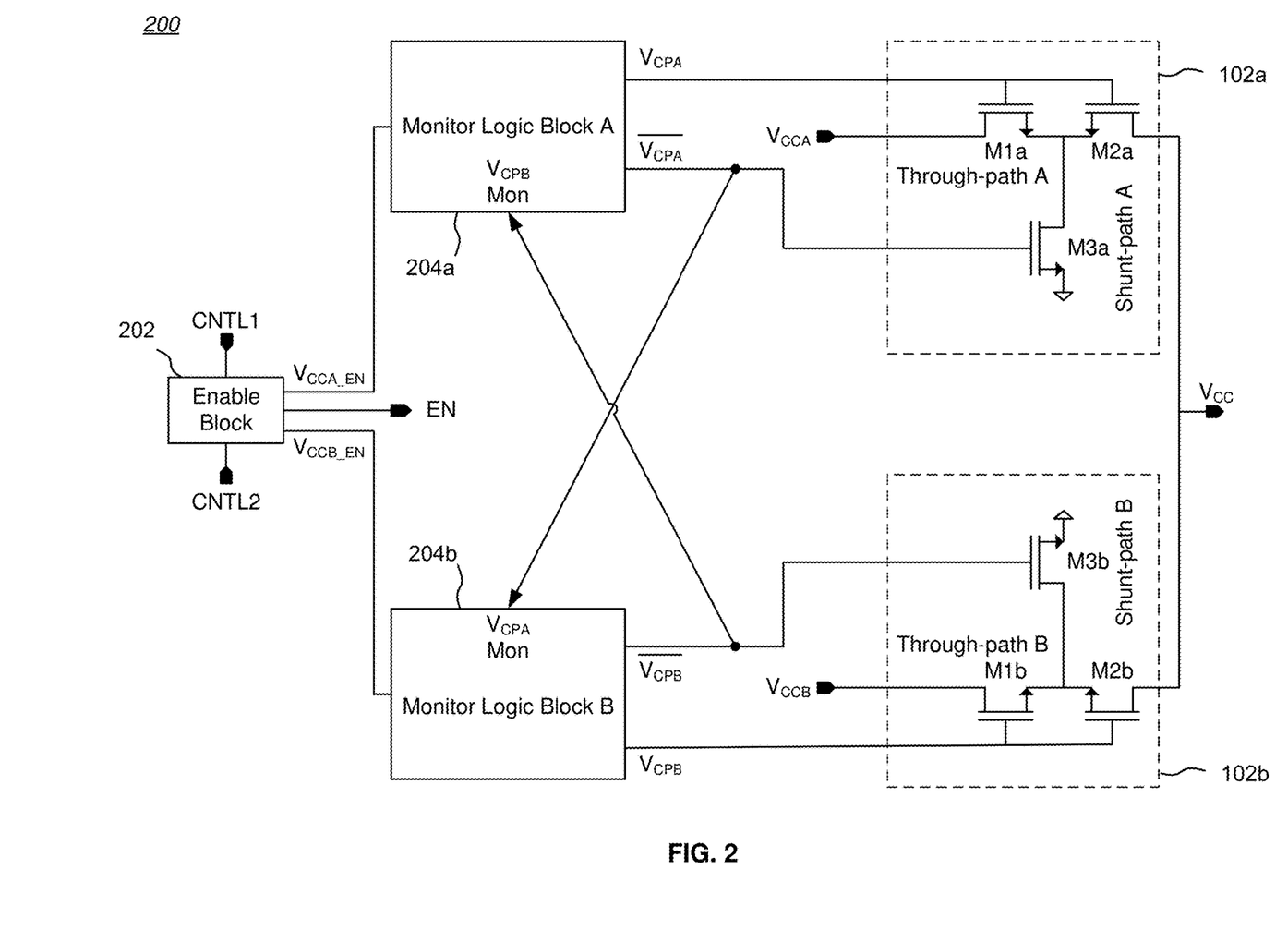
FIG. 2 is a block diagram of an example SPDT switch in accordance with the present invention.

FIG. 2 is a block diagram of an example SPDT switch 200 in accordance with the present invention. Circuit blocks 102a and 102b are the same as shown in FIG. 1 but with labels added to indicate the through-paths (A or B) and shunt-paths (A or B). Added elements include an "enable" block 202 coupled to CNT1 and CNTL2 control signals supplied from an external source, and monitor logic blocks 204a, 202b, each coupled to a corresponding circuit block 102a and 102b.

The enable block 202 implements Truth Table 1, where $V_{CCA\_EN}$ is an enable signal for monitor logic block 204a, $V_{CCB\_EN}$ is an enable signal for monitor logic block 204b, and "EN" is a general enable signal that may be used to enable or disable various circuitry in a system.

| TRUTH TABLE 1 | | | | |
| --- | --- | --- | --- | --- |
| CNTL1 | CNTL2 | $V_{CCA\_EN}$ | $V_{CCB\_EN}$ | EN |
| 0 | 0 | 0 | 0 | 0 |
| 0 | 1 | 0 | 1 | 1 |
| 1 | 0 | 1 | 0 | 1 |
| 1 | 1 | 0 | 0 | 1 |

Assertion of the general enable signal EN may be used, for example, as a "shutdown" signal where all circuitry (analog and/or digital) is disabled to minimize power consumption. One specific example would be an analog bandgap reference circuit that may be used for an internal oscillator to run a charge pump.

Each monitor logic block 204a, 204b controls application of a corresponding control voltage $V_{CPA}$ or $V_{CPB}$ and complementary control voltage $\overline{V_{CPA}}, \overline{V_{CPB}}$ to a corresponding circuit block 102a, 102b as a function of the state of the control voltages for its corresponding circuit block 102a, 102b and the state of one of the control voltages of every other circuit block 102b, 102a. Accordingly, each monitor logic block 204a, 204b is cross-coupled to the control voltage $\overline{V_{CPB}}$, $\overline{V_{CPA}}$ of the other monitor logic block 204b, 204a. Thus, in the illustrated example, a $V_{CPB}$ Monitor port in monitor logic block 204a is cross-coupled to $V_{CPB}$, while a $V_{CPA}$ Monitor port in monitor logic block 204b is cross-coupled to $V_{CPA}$.

The general operation of the SPDT switch 200 may be summarized by Truth Table 2.

TRUTH TABLE 2

| CNTL1 | CNTL2 | $V_{CCA}$ to $V_{CC}$ | $V_{CCB}$ to $V_{CC}$ | Description |
|---|---|---|---|---|
| 0 | 0 | shutdown | shutdown | all circuits shut down |
| 0 | 1 | OFF | ON | $V_{CCB}$ to $V_{CC}$ switch path selected |
| 1 | 0 | ON | OFF | $V_{CCA}$ to $V_{CC}$ switch path selected |
| 1 | 1 | high isolation | high isolation | Both through-paths OFF but internal circuits powered ON |

As one example of detailed operation of the monitor logic blocks 204a, 204b, assume that through-path A controlled by CNT1 is conducting, thus coupling $V_{CCA}$ to $V_{CC}$. In logic terms for this state, $V_{CPA}=1$, $\overline{V_{CPA}}=0$, $\overline{V_{CPB}}=0$, and $\overline{V_{CPB}}=1$. Now assume that CNTL2 is asserted, indicating that through-path B is to become conducting, thus coupling $V_{CCB}$ to $V_{CC}$. In logic terms for this state, $V_{CPA}$ will be set to 0, $\overline{V_{CPA}}$ will be set to 1, $\overline{V_{CPB}}$ will be set to 1, and $\overline{V_{CPB}}$ will be set to 0. However, the change in state is regulated by the monitor logic block 204b, which performs the following two transition steps:
- determining that through-path A is turned OFF (e.g., by determining that $V_{CPA}$ is near or below the threshold voltage $V_{TH}$ of NFETs M1a and M2a) before shunt-path A is allowed to turn ON and before shunt-path B (if present) is allowed to turn OFF from an ON state (note that shunt-path A turning ON only depends on through-path A turning OFF, thus turning shunt-path B OFF does not need to wait until shunt-path A is turned ON; accordingly, for the fastest switching time, shunt-path B may be turned OFF at the same time as through-path A is being turned OFF);
- determining that shunt-path B is turned OFF before through-path B is allowed to turn ON (for the fastest switching time, as soon as both through-path A and shunt-path B are turned OFF, through-path B may be turned ON).

The states and transition steps are reversed if through-path B is initially conducting and then CNTL1 is asserted. These states and transition steps prevent a potentially damaging situation where $V_{CCA}$ or $V_{CCB}$ is applied while a path to ground still exists through an ON shunt-path, or where $V_{CCA}$ and $V_{CCB}$ are directly connected together through the $V_{CC}$ node.

While FIG. 2 shows an SPDT switch, the present invention is readily extendable to switch configurations having more than two input terminals and more than one output terminal, such as matrix switches.

Figure 3A:
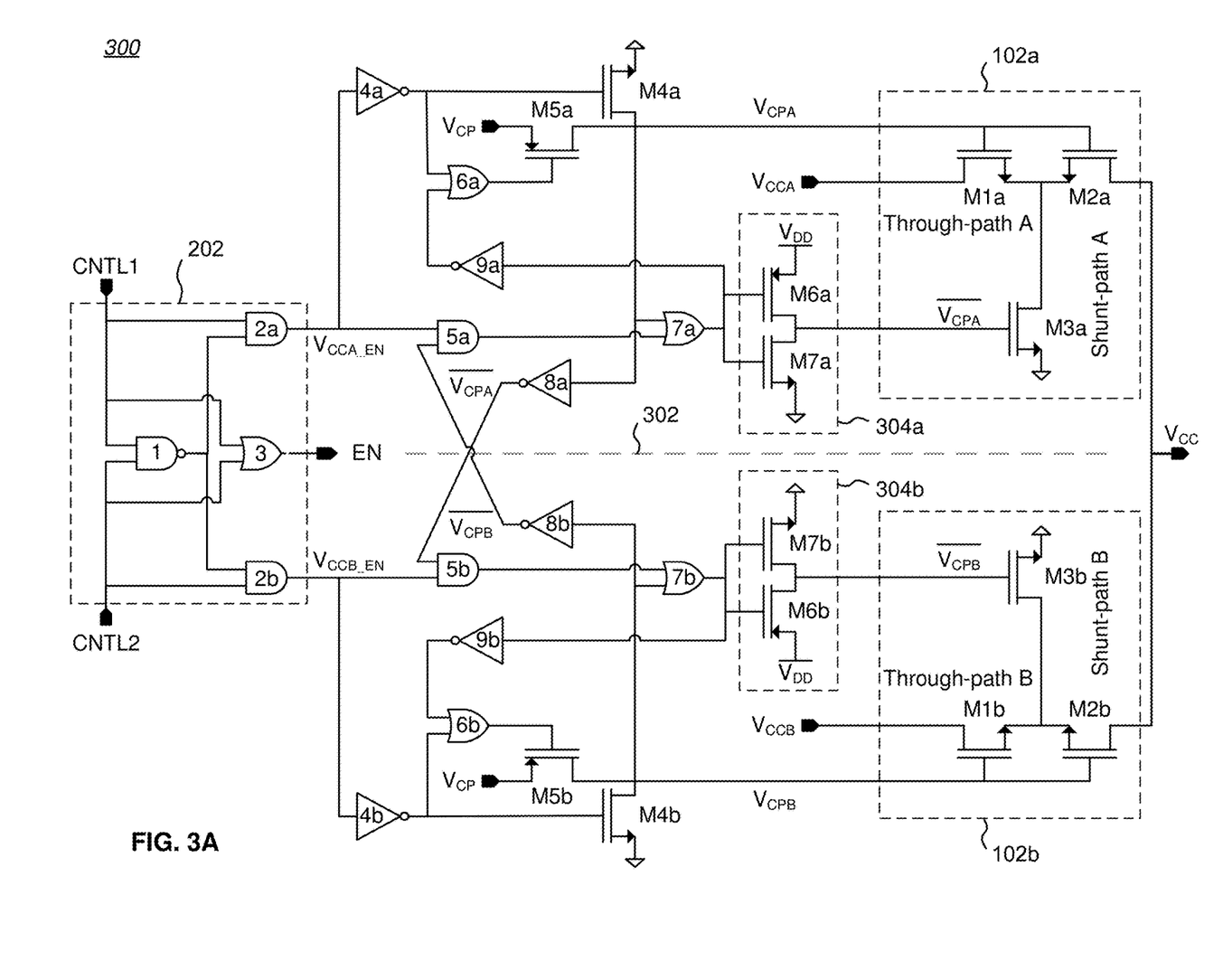
FIG. 3A is a schematic diagram showing a circuit that includes one implementation of the monitor logic blocks in the SPDT switch of FIG. 2.

FIG. 3A is a schematic diagram showing a circuit 300 that includes one implementation of the monitor logic blocks 202a, 202b in the SPDT switch 200 of FIG. 2. Circuit blocks 102a and 102b are the same as shown in FIG. 1 but with labels added to indicate the through-paths (A or B) and shunt-paths (A or B).

Control signals CNT1 and CNTL2 are coupled to an enable block 202, as in FIG. 2. More specifically, CNT1 is coupled to a first input of NAND gate 1, a first input of AND gate 2a, and a first input of OR gate 3. Similarly, CNTL2 is coupled to a second input of NAND gate 1, a first input of AND gate 2b, and a second input of OR gate 3. The output of NAND gate 1 is coupled to a second input of AND gate 2a and to a second input of AND gate 2b. The output of AND gate 2a is an enable signal $V_{CCA\_EN}$ for the $V_{CCA}$ port of circuit block 102a, and the output of AND gate 2b is an enable signal $V_{CCB\_EN}$ for the $V_{CCB}$ port of circuit block 102b. The output of OR gate 3 is a general enable signal EN that may be used to enable or disable various circuitry in a system, as described above.

The remaining circuitry between the enable block 202 and circuit blocks 102a and 102b implement the monitor logic blocks 204a, 204b of FIG. 2. Dashed line 302 indicates that circuity above line 302 (with respect to the page) is part of monitor logic block 204a while circuity below line 302 (with respect to the page) is part of monitor logic block 204b. Logic elements (inverters, AND gates, OR gates) having a reference suffix of "a" belong to monitor logic block 204a, while logic elements having a reference suffix of "b" belong to monitor logic block 204b. The circuitry of both monitor logic blocks 204a, 204b is identical and symmetrical, so only the detailed connections of monitor logic block 204a will be set forth.

Enable signal $V_{CCA\_EN}$ is coupled to the input of inverter 4a and to a first input of AND gate 5a. The output of inverter 4a is coupled to a first input of OR gate 6a and to the gate of NFET M4a. The conduction channel of NFET M4a is coupled between a reference potential (e.g., circuit ground) and the conduction channel of PFET M5a, the gates of NFETs M1a and M2a (which form through-path A), a first input of OR gate 7a, and the input of inverter 8a. The conduction channel of PFET M5a is coupled between a voltage source $V_{CP}$ exceeding the voltage of $V_{CCA}$ (typically supplied from a charge pump as described above) and the gates of NFETs M1a and M2a, the first input of OR gate 7a, and the input of inverter 8a.

The output of inverter 8a is cross-coupled to a second input of AND gate 5b within monitor logic block 204b. Similarly, a second input of AND gate 5a within monitor logic block 204a is cross-coupled to the output of inverter 8b within monitor logic block 204b. The output of AND gate 5b is applied to a second input of OR gate 7a. The output of OR gate 7a is applied to an inverter 304a comprising a PFET M6a and an NFET M7a coupled in series between a voltage supply $V_{DD}$ (e.g., from a battery) and a reference potential; more specifically, the output of OR gate 7a is coupled to the gates of PFET M6a and NFET M7a. The output of OR gate 7a is also applied to an inverter 9a, the output of which is coupled to a second input of OR gate 6a. The output of OR gate 6a is coupled to a second input of OR gate 6b, the output of which is coupled to the gate of PFET M5a.

The inverter 304a is shown at the FET level rather than the symbolic level to highlight that PFET M6a may be implemented as a small—and therefore "weak" or slow—PFET while NFET Ma may be implemented as a larger, faster NFET. A small PFET takes somewhat more time to turn ON to a conductive state in order to supply sufficient charge to the gate of switch NFET M3a to turn that switch ON, thereby turning shunt-path A ON, but reduces the area of the driver circuit. Turning shunt-path A ON slowly helps ensure that shunt-path A and through-path A are not ON at the same time. Also, once through-path A is turned OFF, it is not necessary to turn ON shunt-path A fast. For T-switch configurations, NFET M3a turning ON is necessary for good isolation but since it takes some time for the switches (NFETs M1b and M2b) of through-path B to turn ON, there is no need to turn ON NFET M3a fast. Note that while the pull-up PFET M6a can be weak to turn NFET M3a slowly ON, NFET M7a should be sized so as to turn ON fast in order to turn NFET M3a OFF fast, because the turn ON of NFETs M1a and M2a can only occur after NFET M3a is turned OFF. If NFET M3a turns OFF slow, the switching time will be affected. Note also that a conventional inverter that does not have a lopsided P-to-N strength ratio will still function, just not optimally.

Figure 3B:
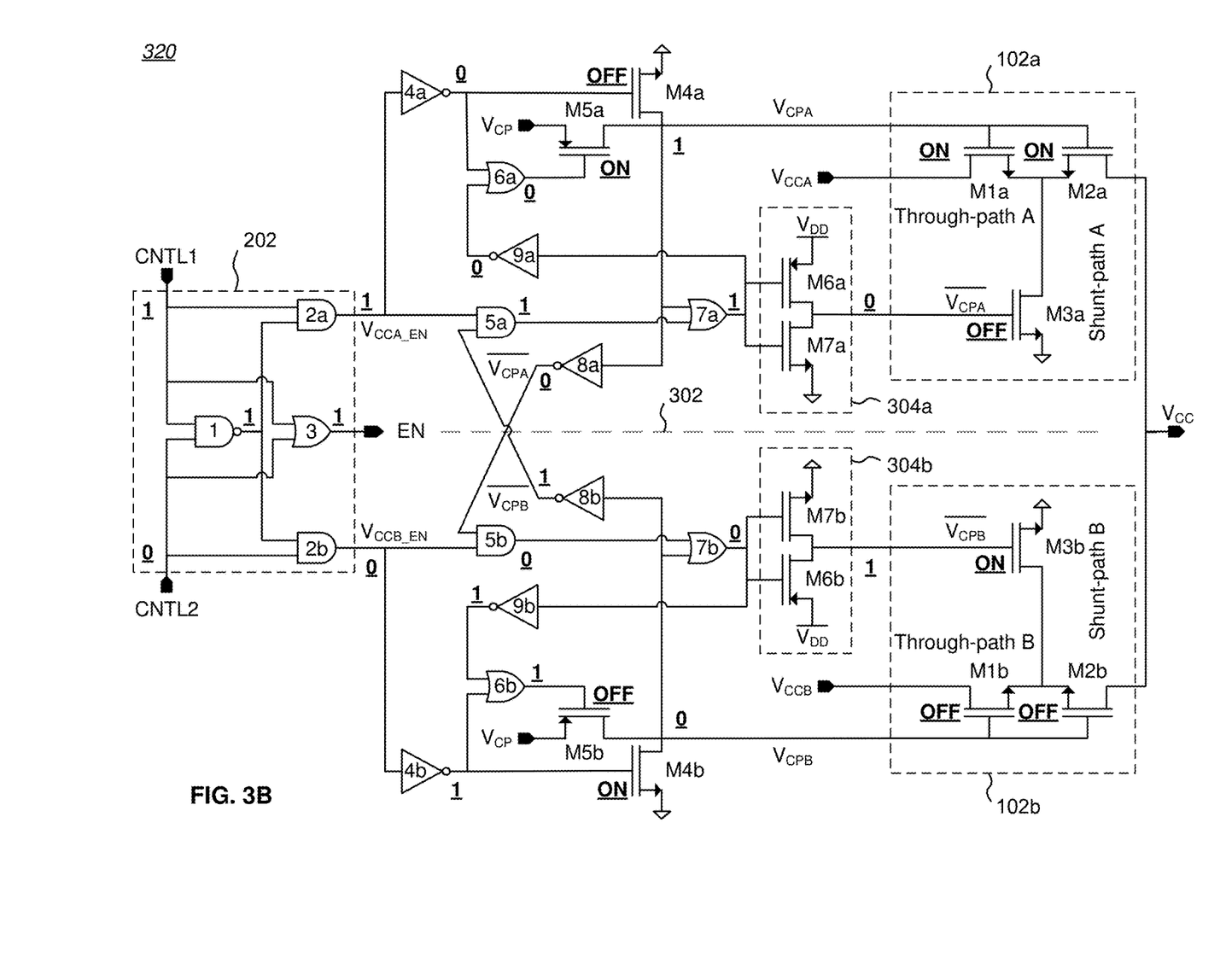
FIG. 3B is a schematic diagram showing an instance of the circuit of FIG. 3A for the case of CNTL1=1 and CNTL2=0, resulting in $V_{CC}=V_{CCA}$.
Figure 3C:
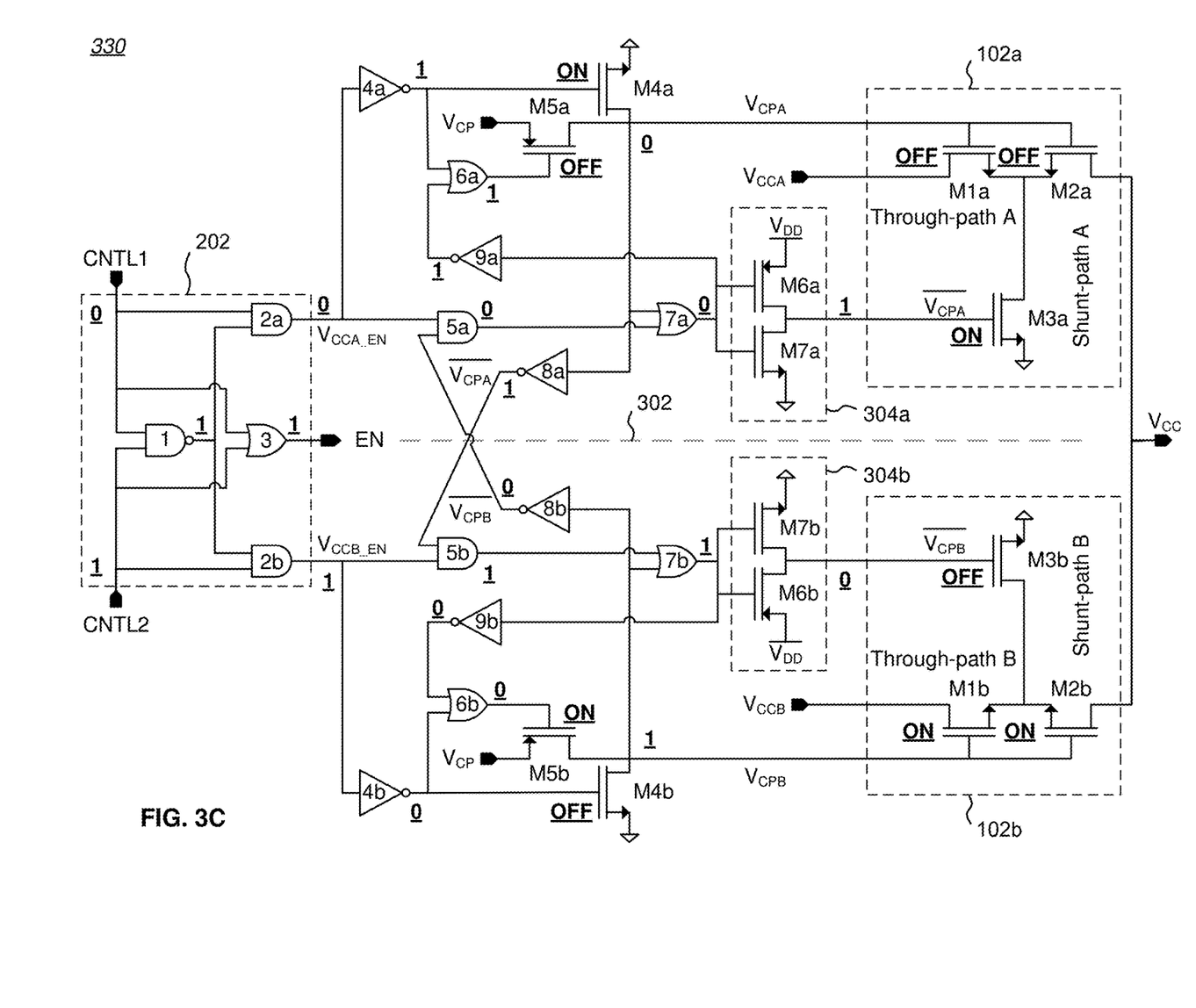
FIG. 3C is a schematic diagram showing an instance of the circuit of FIG. 3A for the case of CNTL1=0 and CNTL2=1, resulting in $V_{CC}=V_{CCB}$.
Figure 3D:
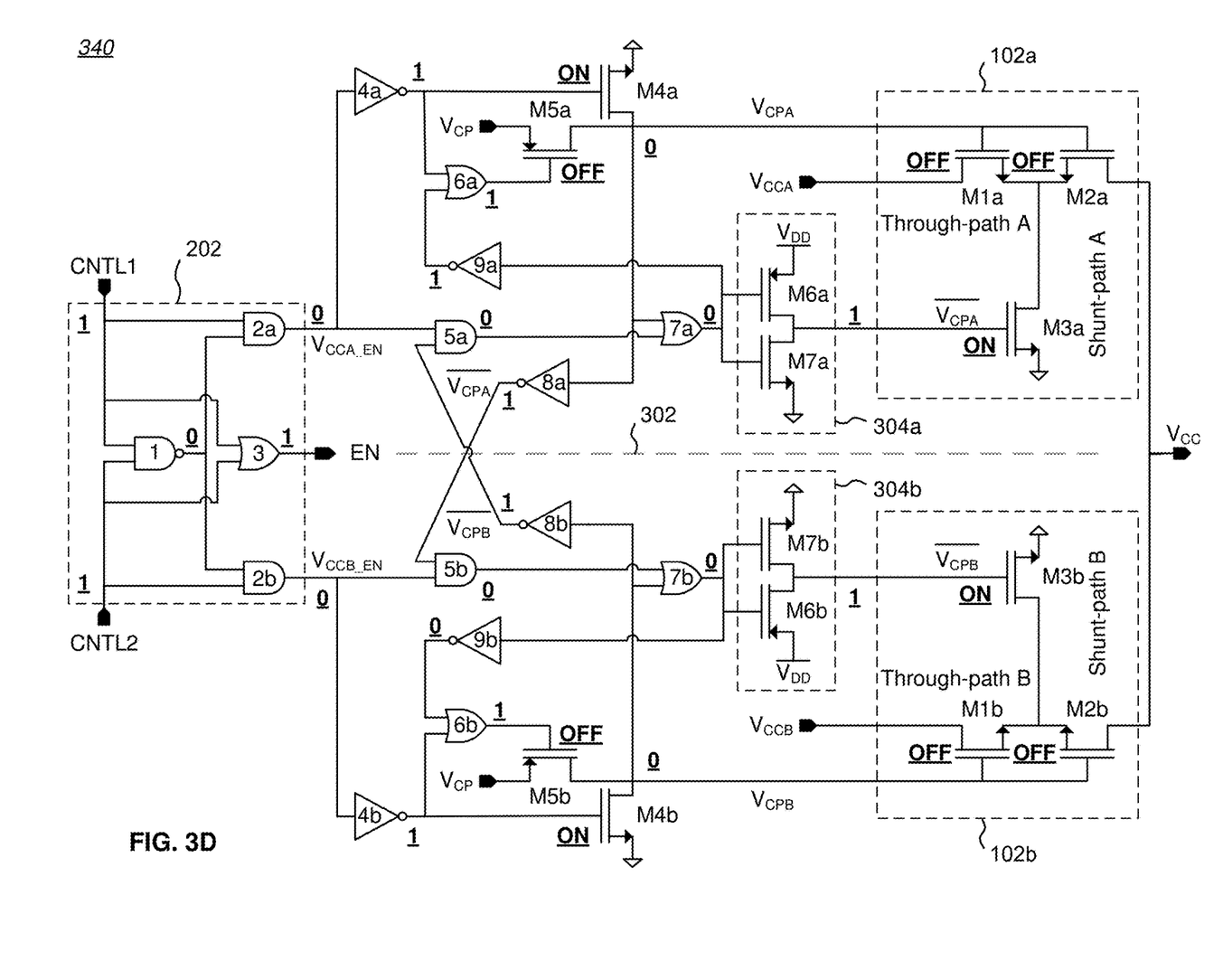
FIG. 3D is a schematic diagram showing an instance of the circuit of FIG. 3A for the case of CNTL1=1 and CNTL2=1, resulting in OFF states for through-path A and through-path B.

FIG. 3B is a schematic diagram showing an instance 320 of the circuit 300 of FIG. 3A for the case of CNTL1=1 and CNTL2=0, resulting in $V_{CC}=V_{CCA}$. FIG. 3C is a schematic diagram showing an instance 330 of the circuit 300 of FIG. 3A for the case of CNTL1=0 and CNTL2=1, resulting in $V_{CC}=V_{CCB}$. FIG. 3D is a schematic diagram showing an instance 340 of the circuit 300 of FIG. 3A for the case of CNTL1=1 and CNTL2=1, resulting in OFF states for through-path A and through-path B. The outputs of logic elements are indicated in bold, underlined binary values (0 and 1), and the state of FETs is indicated by bold, underlined "ON" or "OFF" labels (noting that PFETS are ON when the gate input is a logical 0, while NFETS are ON when the gate input is a logical 1). For the case of CNTL1=0 and CNTL2=0, EN=0, which may be used, for example, to disable all circuits.

Considering FIG. 3B, when CNTL1 is set to 0 and CNTL2 is set to 1 in order to turn through-path A OFF and through-path B ON, note that NFET M4A will turn ON quite quickly (2gate delays plus NFET switching time). When NFET M4A conducts, it will quickly pull the gates of M1a and M2a to ground, turning through-path A OFF. In the meantime, the output of gate 7a will switch to 0. It will take some time for small PFET M6a in inverter 304a to charge up the gate of NFET M3a sufficiently to turn NFET M3a ON, thus turning shunt-path A ON, but only after through-path A is OFF. Further, through-path A turns OFF faster than the change in state of the cross-coupled signal output by inverter 8a (from 0 to 1) can propagate through AND gate 5b, OR gate 7b, and inverter 304b to turn NFET M3b OFF. Accordingly, the criterion set forth above for the first transition step is met: through-path A is turned OFF before shunt-path A is allowed to turn ON and before shunt-path B is allowed to turn OFF.

The criterion set forth above for the second transition step is also met. Through-path B cannot turn ON until OR gate 7b changes from 0 to 1 (resulting in inverter 304b turning NFET M3b OFF) and the output of OR gate 7b propagates through inverter 9b and OR gate 6b to the gate of PFET M5b. Only after sufficient charge has drained from the gate of PFET M5b will that gate turn ON, coupling $V_{CP}$ to the gates of NFETS M1b and M2b, which will take some time to charge on turn those NFETs ON. Thus, shunt-path B will turn OFF before through-path B can turn ON.

It should be appreciated that the "break-before-make" circuitry of FIG. 3A can be adapted to switch circuits having more than two through-paths, and that switch circuits having more than two inputs can be created by cascading multiple SPDT embodiments of the circuitry of FIG. 3A (e.g., a 4-input, single output switch circuit can be assembled from three SPDT switch circuits of the type shown in FIG. 3A, with the output of two of the SPDT switch circuits being coupled to the first and second inputs of the third SPDT switch circuit.

Circuit Embodiments

Circuits and devices in accordance with the present invention may be used alone or in combination with other components, circuits, and devices. Embodiments of the present invention may be fabricated as integrated circuits (ICs), which may be encased in IC packages and/or in modules for case of handling, manufacture, and/or improved performance. In particular, IC embodiments of this invention are often used in modules in which one or more of such ICs are combined with other circuit components or blocks (e.g., filters, amplifiers, passive components, and possibly additional ICs) into one package. The ICs and/or modules are then typically combined with other components, often on a printed circuit board, to form part of an end-product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

Figure 4:
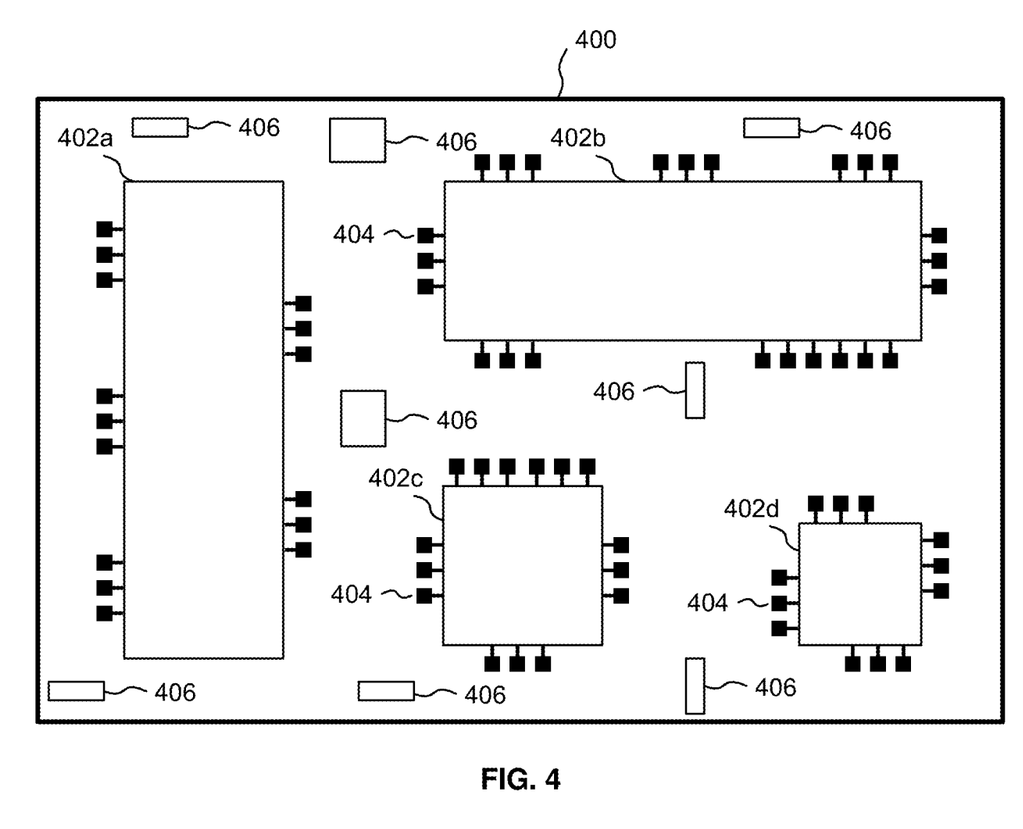
FIG. 4 is a top plan view of a substrate that may be, for example, a printed circuit board or chip module substrate (e.g., a thin-film tile).

As one example of further integration of embodiments of the present invention with other components, FIG. 4 is a top plan view of a substrate 400 that may be, for example, a printed circuit board or chip module substrate (e.g., a thin-film tile). In the illustrated example, the substrate 400 includes multiple ICs 402a-402d having terminal pads 404 which would be interconnected by conductive vias and/or traces on and/or within the substrate 400 or on the opposite (back) surface of the substrate 400 (to avoid clutter, the surface conductive traces are not shown and not all terminal pads are labelled). The ICs 402a-402d may embody, for example, signal switches, active and/or passive filters, amplifiers (including one or more LNAs), and other circuitry. For example, IC 402b may incorporate one or more instances of an electronic switch of the type shown in FIGS. 2 and 3A-3D.

The substrate 400 may also include one or more passive devices 406 embedded in, formed on, and/or affixed to the substrate 400. While shown as generic rectangles, the passive devices 406 may be, for example, filters, capacitors, inductors, transmission lines, resistors, antennae elements, transducers (including, for example, MEMS-based transducers, such as accelerometers, gyroscopes, microphones, pressure sensors, etc.), batteries, etc., interconnected by conductive traces on or in the substrate 400 to other passive devices 406 and/or the individual ICs 402a-402d. The front or back surface of the substrate 400 may be used as a location for the formation of other structures.

System Aspects

Embodiments of the present invention are useful in a wide variety of larger radio frequency (RF) circuits and systems for performing a range of functions, including (but not limited to) impedance matching circuits, RF power amplifiers, RF low-noise amplifiers (LNAs), phase shifters, attenuators, antenna beam-steering systems, charge pump devices, RF switches, etc. Such functions are useful in a variety of applications, such as radar systems (including phased array and automotive radar systems), radio systems (including cellular radio systems), and test equipment.

Radio system usage includes wireless RF systems (including base stations, relay stations, and hand-held transceivers) that use various technologies and protocols, including various types of orthogonal frequency-division multiplexing ("OFDM"), quadrature amplitude modulation ("QAM"), Code-Division Multiple Access ("CDMA"), Time-Division Multiple Access ("TDMA"), Wide Band Code Division Multiple Access ("W-CDMA"), Global System for Mobile Communications ("GSM"), Long Term Evolution ("LTE"), 5G, 6G, and WiFi (e.g., 802.11a, b, g, ac, ax, be) protocols, as well as other radio communication standards and protocols.

Methods

Figure 5:
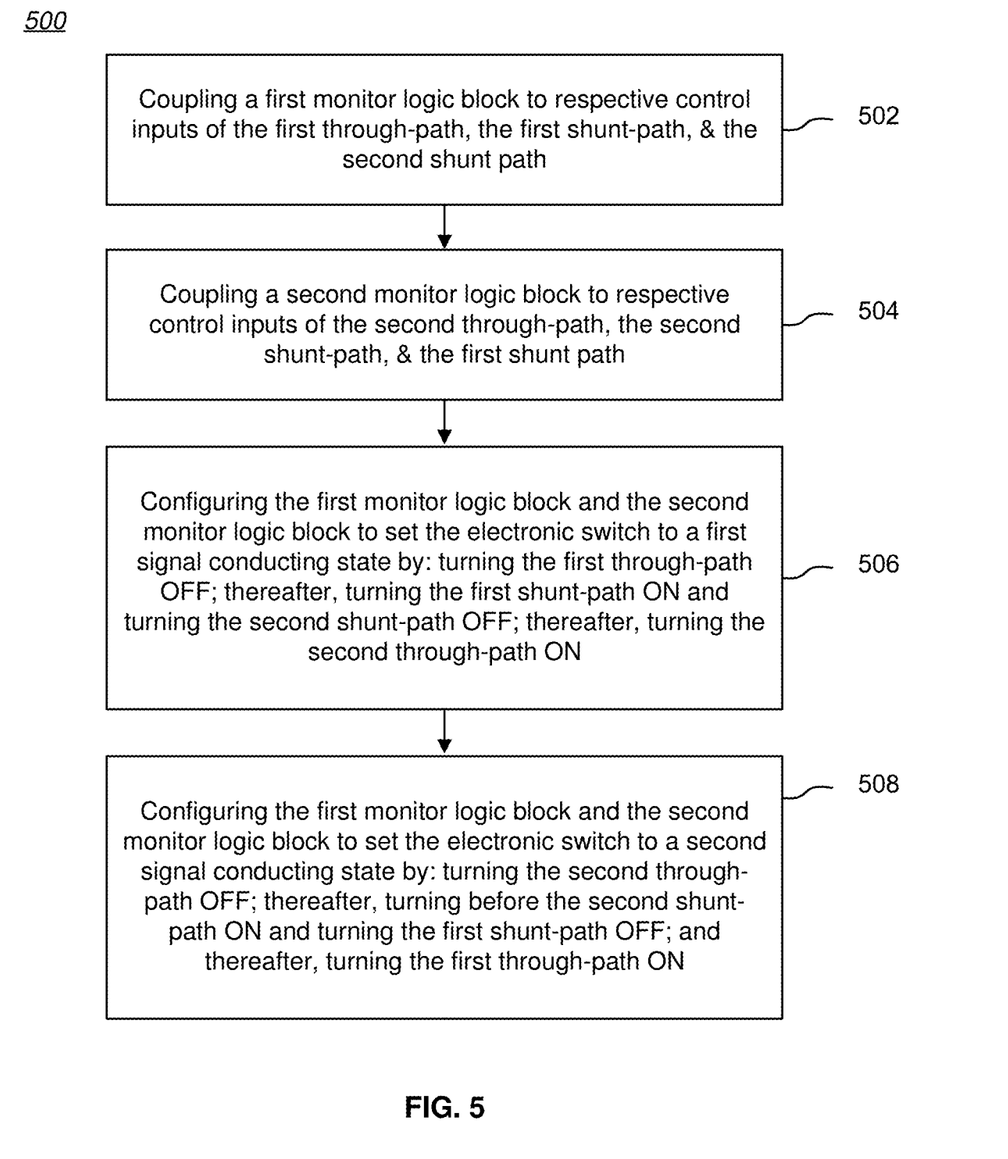
FIG. 5 is a process flow chart showing one method for operating an electronic switch.

Another aspect of the invention includes methods for operating an electronic switch that includes a first through-path coupled between a first input terminal and an output terminal, and a first shunt-path coupled between the first through-path and a reference potential, and a second through-path coupled between a second input terminal and the output terminal, and a second shunt-path coupled between the second through-path and a reference potential. For example, FIG. 5 is a process flow chart 500 showing one method for operating an electronic switch. The method includes: coupling a first monitor logic block to respective control inputs of the first through-path, the first shunt-path, and the second shunt path (Block 502); coupling a second monitor logic block to respective control inputs of the second through-path, the second shunt-path, and the first shunt path (Block 504); configuring the first monitor logic block and the second monitor logic block to set the electronic switch to a first signal conducting state by: turning the first through-path OFF; thereafter, turning the first shunt-path ON and turning the second shunt-path OFF; thereafter, turning the second through-path ON (Block 506); and configuring the first monitor logic block and the second monitor logic block to set the electronic switch to a second signal conducting state by: turning the second through-path OFF; thereafter, turning before the second shunt-path ON and turning the first shunt-path OFF; and thereafter, turning the first through-path ON (Block 508).

Additional aspects of the above method may include one or more of the following: wherein the first monitor logic block is responsive to a first combination of a first control signal and a second control signal, and the second monitor logic block responsive to a second combination of the first control signal and the second control signal; wherein the first through-path and the second through-path each include a first NFET coupled in series to a second NFET; wherein the first shunt-path and the second shunt-path each include an NFET coupled to a node between the first and second NFETs, and configured to be coupled to a reference potential; and/or wherein turning the first shunt-path ON is through a first inverter circuit including a PFET and an NFET coupled in series between a voltage supply and a reference potential, and turning the second shunt-path ON is through a second inverter circuit including a PFET and an NFET coupled in series between a voltage supply and a reference potential, wherein each PFET is sized to slowly turn ON the corresponding shunt-path.

Fabrication Technologies & Options

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

With respect to the figures referenced in this disclosure, the dimensions for the various elements are not to scale; some dimensions may be greatly exaggerated vertically and/or horizontally for clarity or emphasis. In addition, references to orientations and directions (e.g., "top", "bottom", "above", "below", "lateral", "vertical", "horizontal", etc.) are relative to the example drawings, and not necessarily absolute orientations or directions.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies, such as bipolar junction transistors (BJTs), BiCMOS, LDMOS, BCD, GaAs HBT, GaN HEMT, GaAs pHEMT, MESFET, InP HBT, InP HEMT, FinFET, GAAFET, and SiC-based device technologies, using 2-D, 2.5-D, and 3-D structures. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Conclusion

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. An electronic switch, including:
   (a) a first through-path coupled between a first input terminal and an output terminal, and a first shunt-path coupled between the first through-path and a reference potential;
   (b) a second through-path coupled between a second input terminal and the output terminal, and a second shunt-path coupled between the second through-path and a reference potential;
   (c) a first monitor logic block coupled to respective control inputs of the first through-path, the first shunt-path, and the second shunt path, the first monitor logic block responsive to a first combination of a first control signal and a second control signal;
   (d) a second monitor logic block coupled to respective control inputs of the second through-path, the second shunt-path, and the first shunt path, the second monitor logic block responsive to a second combination of the first control signal and the second control signal;
   wherein the first monitor logic block and the second monitor logic block are configured such that the first through-path is turned OFF before the first shunt-path is allowed to turn ON and before the second shunt-path is allowed to turn OFF, and the second shunt-path is turned OFF before the second through-path is allowed to turn ON; and
   wherein the first monitor logic block and the second monitor logic block are configured such that the second through-path is turned OFF before the second shunt-path is allowed to turn ON and before the first shunt-path is allowed to turn OFF, and the first shunt-path is turned OFF before the first through-path is allowed to turn ON.

2. The electronic switch of claim 1, wherein the first through-path and the second through-path each include a first NFET coupled in series to a second NFET.

3. The electronic switch of claim 2, wherein the first shunt-path and the second shunt-path each include an NFET coupled to a node between the first and second NFETs, and configured to be coupled to a reference potential.

4. The electronic switch of claim 1, further including an enable block configured to enable the first and second monitor logic blocks to enable the first through-path and the second shunt-path and disable the second through-path and the first shunt-path in response to receipt of the first combination of the first control signal and the second control signal, and to enable the second through-path and the first shunt-path and disable the first through-path and the second shunt-path in response to receipt of the second combination of the first control signal and the second control signal.

5. The electronic switch of claim 1, wherein the first monitor logic block is coupled to a control input of the first shunt-path through a first inverter circuit including a PFET and an NFET coupled in series between a voltage supply and a reference potential, and the second monitor logic block is coupled to a control input of the second shunt-path through a second inverter circuit including a PFET and an NFET coupled in series between a voltage supply and a reference potential, wherein each PFET is sized to slowly turn ON the corresponding shunt-path.

6. An electronic switch, including:
   (a) a first input terminal;
   (b) a second input terminal;
   (c) an output terminal;
   (d) a first circuit block including a first through-path coupled between the first input terminal and the output terminal, and a first shunt-path coupled between the first through-path and a reference potential;
   (e) a second circuit block including a second through-path coupled between the second input terminal and the output terminal, and a second shunt-path coupled between the second through-path and a reference potential;
   (f) an enable block configured to receive a first control signal input and a second control signal input;
   (g) a first monitor logic block coupled between the enable block and the first circuit block; and
   (h) a second monitor logic block coupled between the enable block and the second circuit block;
   wherein the first and second monitor logic blocks each have a cross-coupled connection to the other monitor logic block;
   wherein the first monitor logic block and the second monitor logic block are configured such that the first through-path cannot turn ON to conduct a signal until the second through-path is OFF and the first shunt-path is OFF; and
   wherein the first monitor logic block and the second monitor logic block are configured such that the second through-path cannot turn ON to conduct a signal until the first through-path is OFF and the second shunt-path is OFF.

7. The electronic switch of claim 6, wherein the first through-path and the second through-path each include a first NFET coupled in series to a second NFET.

8. The electronic switch of claim 7, wherein the first shunt-path and the second shunt-path each include an NFET coupled to a node between the first and second NFETs, and configured to be coupled to a reference potential.

9. The electronic switch of claim 6, wherein the enable block is configured to enable the first and second monitor logic blocks to enable the first through-path and the second shunt-path and disable the second through-path and the first shunt-path in response to receipt of the first combination of the first control signal and the second control signal, and to enable the second through-path and the first shunt-path and disable the first through-path and the second shunt-path in response to receipt of the second combination of the first control signal and the second control signal.

10. The electronic switch of claim 6, wherein the first monitor logic block is coupled to a control input of the first shunt-path through a first inverter circuit including a PFET and an NFET coupled in series between a voltage supply and a reference potential, and the second monitor logic block is coupled to a control input of the second shunt-path through a second inverter circuit including a PFET and an NFET coupled in series between a voltage supply and a reference potential, wherein each PFET is sized to slowly turn ON the corresponding shunt-path.

11. An electronic switch, including:
   (a) a first input terminal;
   (b) a second input terminal;
   (c) an output terminal;

(d) a first circuit block including a first through-path coupled between the first input terminal and the output terminal, and a first shunt-path coupled between the first through-path and a reference potential;

(e) a second circuit block including a second through-path coupled between the second input terminal and the output terminal, and a second shunt-path coupled between the second through-path and a reference potential;

(f) an enable block configured to receive a first control signal input and a second control signal input;

(g) a first monitor logic block coupled between the enable block and the first circuit block; and (h) a second monitor logic block coupled between the enable block and the second circuit block;

wherein the first and second monitor logic blocks each have a cross-coupled connection to the other monitor logic block;

wherein the first monitor logic block and the second monitor logic block are configured such that the first through-path is turned OFF before the first shunt-path is allowed to turn ON and before the second shunt-path is allowed to turn OFF, and the second shunt-path is turned OFF before the second through-path is allowed to turn ON; and wherein the first monitor logic block and the second monitor logic block are configured such that the second through-path is turned OFF before the second shunt-path is allowed to turn ON and before the first shunt-path is allowed to turn OFF, and the first shunt-path is turned OFF before the first through-path is allowed to turn ON.

12. The electronic switch of claim 11, wherein the first through-path and the second through-path each include a first NFET coupled in series to a second NFET.

13. The electronic switch of claim 12, wherein the first shunt-path and the second shunt-path each include an NFET coupled to a node between the first and second NFETs, and configured to be coupled to a reference potential.

14. The electronic switch of claim 11, wherein the enable block is configured to enable the first and second monitor logic blocks to enable the first through-path and the second shunt-path and disable the second through-path and the first shunt-path in response to receipt of the first combination of the first control signal and the second control signal, and to enable the second through-path and the first shunt-path and disable the first through-path and the second shunt-path in response to receipt of the second combination of the first control signal and the second control signal.

15. The electronic switch of claim 11, wherein the first monitor logic block is coupled to a control input of the first shunt-path through a first inverter circuit including a PFET and an NFET coupled in series between a voltage supply and a reference potential, and the second monitor logic block is coupled to a control input of the second shunt-path through a second inverter circuit including a PFET and an NFET coupled in series between a voltage supply and a reference potential, wherein each PFET is sized to slowly turn ON the corresponding shunt-path.

* * * * *

UNITED STATES PATENT AND TRADEMARK OFFICE
CERTIFICATE OF CORRECTION

| | | |
|---|---|---|
| PATENT NO. | : 12,456,975 B2 | Page 1 of 1 |
| APPLICATION NO. | : 18/664635 | |
| DATED | : October 28, 2025 | |
| INVENTOR(S) | : Wu et al. | |

It is certified that error appears in the above-identified patent and that said Letters Patent is hereby corrected as shown below:

In the Specification

Column 4, Line 37, change "coupled to CNT1" to --coupled to CNTL1--.

Column 5, Line 25, change "CNT1 is conducting" to --CNTL1 is conducting--.

Column 6, Line 1, change "Control signals CNT1" to --Control signals CNTL1--.

Column 6, Line 2, change "More specifically, CNT1 is" to --More specifically, CNTL1 is--.

Column 6, Line 59, change "while NFET Ma may be" to --while NFET M7a may be--.

Column 8, Line 7, change "for case of handling" to --for ease of handling--.

Signed and Sealed this
Twenty-fifth Day of November, 2025

John A. Squires
*Director of the United States Patent and Trademark Office*